US007222041B2

(12) United States Patent
Iorga

(10) Patent No.: US 7,222,041 B2
(45) Date of Patent: May 22, 2007

(54) HIGH-SPEED DIGITAL MULTIPLEXER

(75) Inventor: Cosmin Iorga, Oak Park, CA (US)

(73) Assignee: Teradyne, Inc., North Reading, MA (US)

( * ) Notice: Subject to any disclaimer, the term of this patent is extended or adjusted under 35 U.S.C. 154(b) by 940 days.

(21) Appl. No.: 10/010,547

(22) Filed: Nov. 8, 2001

(65) Prior Publication Data

US 2003/0086376 A1    May 8, 2003

(51) Int. Cl.
*G01R 31/00* (2006.01)

(52) U.S. Cl. .................. 702/120; 702/702; 702/118

(58) Field of Classification Search ............... 702/120, 702/118, 121, 126
See application file for complete search history.

(56) References Cited

U.S. PATENT DOCUMENTS 5,959,871 A * 9/1999 Pierzchala et al. ............. 703/4
6,272,669 B1 * 8/2001 Anderson et al. ............. 716/16
6,535,766 B1 * 3/2003 Thompson et al. ........... 607/60
2002/0048826 A1 * 4/2002 Richmond et al. ............ 438/14

* cited by examiner

*Primary Examiner*—Marc S. Hoff
*Assistant Examiner*—Anthony Gutierrez
(74) *Attorney, Agent, or Firm*—David J. Rikkers; Foley & Lardner LLP

(57) ABSTRACT

A high-speed digital multiplexer is disclosed. The multiplexer includes a plurality of input pins for receiving a plurality of digital input signals and switching circuitry coupled to the input pins. The switching circuitry has respective outputs coupled to a common node and is operative to enable a selected one of the plurality of input pins. The multiplexer further includes a local signal converter having a circuit branch set to a common voltage. The branch is connected to the common node to sense changes in current corresponding to an input signal received by an enabled input pin. An output pin is coupled to the local signal converter, whereby the local signal converter is operative to produce voltage changes at the output corresponding to the sensed current changes.

18 Claims, 4 Drawing Sheets

HIGH-SPEED DIGITAL MULTIPLEXER

FIELD OF THE INVENTION

The invention relates generally to automatic test equipment and more particularly a high-speed digital multiplexer for use on a device-interface-board.

BACKGROUND OF THE INVENTION

Automatic test equipment (ATE) often plays a crucial role in the fabrication of semiconductor devices. The equipment allows a manufacturer to functionally test its devices, ensuring device operability at pre-set specifications prior to entering the marketplace. Utilized as a measurement tool, the equipment typically provides electronic channels that correspond to the input and output pins of a semiconductor device. The device is typically inserted in a test socket that forms a portion of a device-interface-board (DIB). By sending signals to and retrieving signals from the device, operation in a real-world environment may be simulated by the ATE.

There are often instances where an ATE user wishes to isolate and select one channel from a group of tester channels. Calibrating the channel to a reference and validating the channel timing accuracy are but a few examples. A straightforward way to select one channel from a group of channels is to employ a multiplexer on the DIB.

Typical multiplexers include a plurality of input pins and a switching scheme for activating a selected pin. The switching circuitry terminates in a common node, which then completes a signal path to the multiplexer output pin. Input signals received on the pin are then passed through the multiplexer along the common node, and passed through to the multiplexer output. In this manner, a digital signal propagating along an activated channel is passed directly through the multiplexer, and on to the calibration or validation circuitry.

While this straightforward selection scheme works well for its intended low-frequency applications, the basic structure can be problematic for high-speed (frequency) applications. The problems are primarily caused by a relatively large capacitance on the common node, due to the numerous parallel connections to the switches associated with the input pins. Signals passed through a single channel to the node are susceptible to RC effects at the node (from charging and discharging the capacitance, etc.), often significantly affecting the quality of the rising and falling edges of the signal. This is an undesirable problem for high-accuracy ATE, where edge placement timing accuracy may be a critical parameter.

What is needed and currently unavailable is a high-speed digital multiplexer that avoids the parasitic problem described above. The high-speed digital multiplexer of the present invention satisfies this need.

SUMMARY OF THE INVENTION

The high-speed digital multiplexer of the present invention provides a way of passing one of a selected number of input signals to an output with minimal degradation due to parasitic effects acting on the passed signal. This allows for a high level of timing accuracy for the selected signal.

To realize the foregoing advantages, the invention in one form comprises a high-speed digital multiplexer. The multiplexer includes a plurality of input pins for receiving a plurality of digital input signals and switching circuitry coupled to the input pins. The switching circuitry has respective outputs coupled to a common node and is operative to enable a selected one of the plurality of input pins. The multiplexer further includes a local signal converter having a circuit branch set to a common voltage. The branch is connected to the common node to sense changes in current corresponding to an input signal received by an enabled input pin. An output pin is coupled to the local signal converter, whereby the local signal converter is operative to produce voltage pulses at the output corresponding to the sensed current changes.

In another form, the invention comprises a device-interface-board for calibration/validation of automatic test equipment. The device-interface-board includes at least one test socket adapted for receiving a device-under-test and a high-speed digital multiplexer for selectively passing tester signals from the automatic test equipment to the test socket. The multiplexer includes a plurality of input pins adapted for coupling to a plurality of automatic test equipment channels and switching circuitry coupled to the input pins. The switching circuitry has respective outputs coupled to a common node and is operative to enable a selected one of the plurality of input pins. The multiplexer further includes a local signal converter having a circuit branch set to a common voltage. The branch is connected to the common node to sense changes in current corresponding to an input signal received by an enabled input pin. An output pin is coupled to the local signal converter, whereby the local signal converter is operative to produce voltage changes at the output corresponding to the sensed current changes.

In a further form, the invention comprises a method of selecting one from a plurality of high-speed digital input signals applied to a plurality of input pins. The input pins are coupled through switching circuitry to a common node. The method comprises the steps of applying a constant voltage to the common node; activating the pin corresponding to the selected input signal; detecting current changes at the common node caused by the selected input signal; and producing output voltage changes corresponding to the detected current changes.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
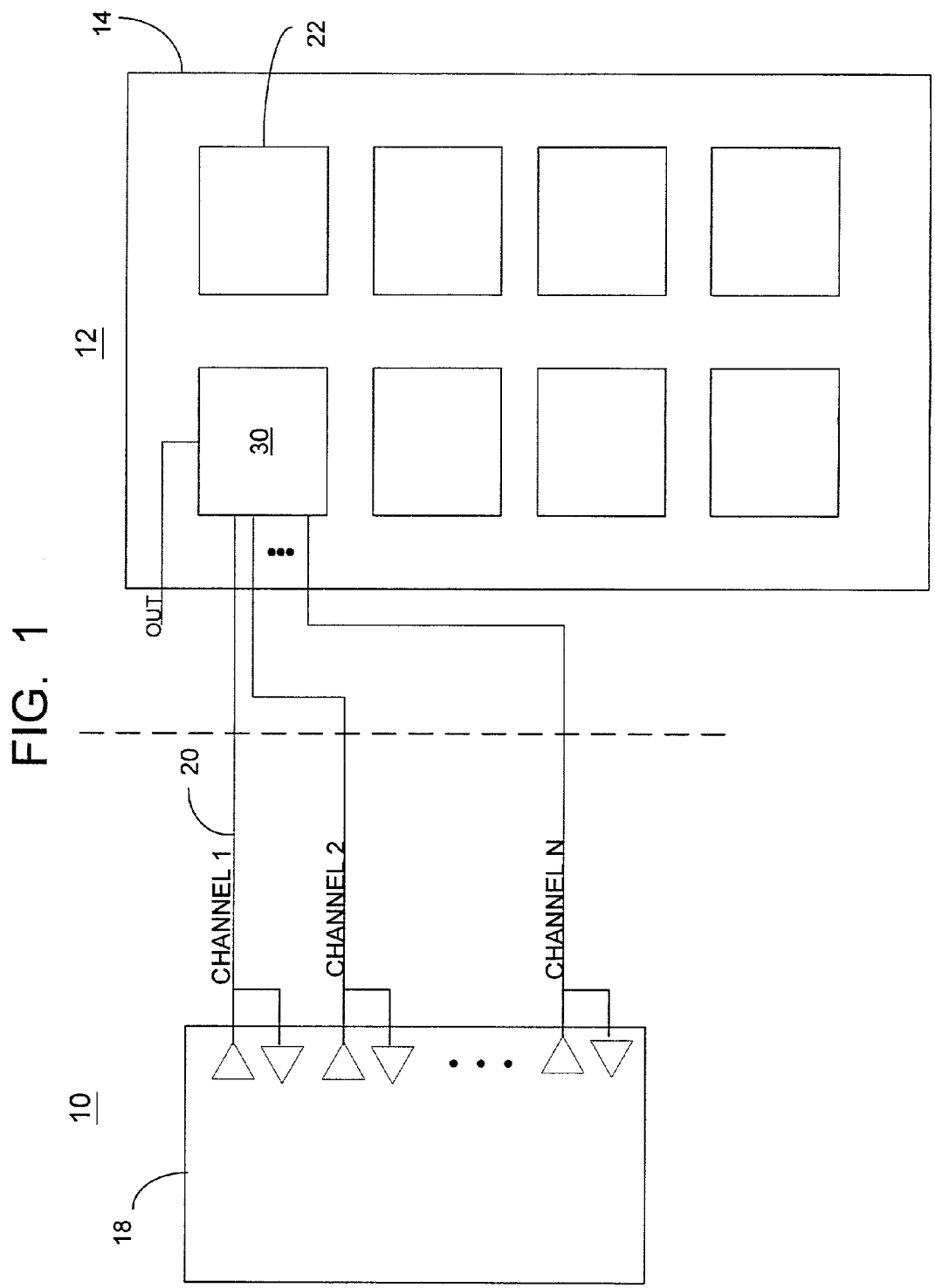
FIG. 1 is a partial block diagram of a semiconductor test system employing one embodiment of the present invention.

Referring now to FIG. 1, a semiconductor tester 10 is shown coupled to a handling apparatus 12 that includes a device interface board (DIB) 14. The tester includes a testhead (not shown) that houses a plurality of pin electronics channel cards 18 for generating tester waveforms along a plurality of channels 20. The channels direct the waveforms to the input pins of one or more DUTs (not shown), and receive output waveforms from the DUT(s). The DIB includes one or more sockets 22 for electrically coupling the DUT pins to the tester channels, thereby providing a convenient tester-to-DUT signal interface.

Figure 2:
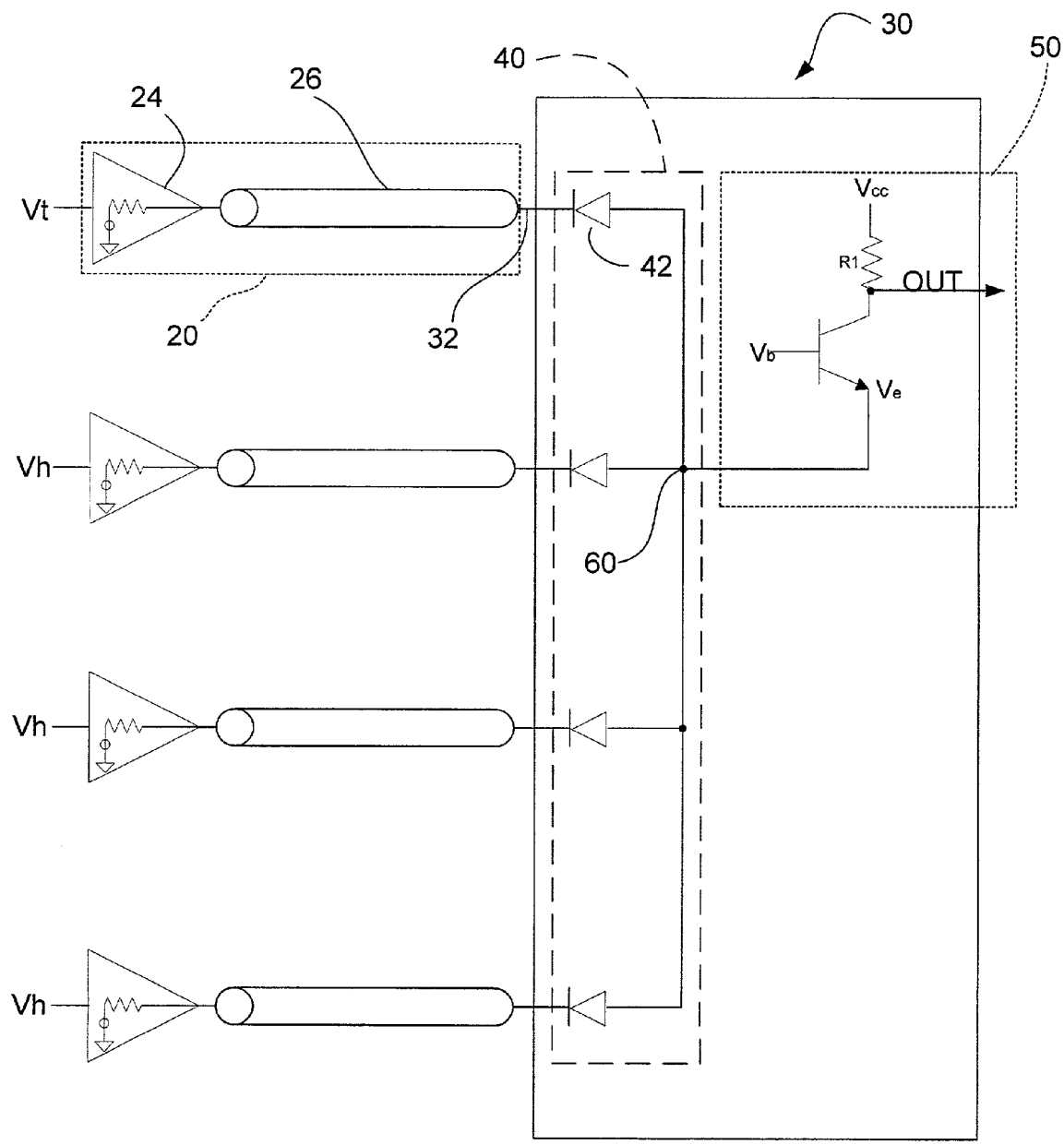
FIG. 2 is a block diagram of a high-speed multiplexer according to one form of the present invention.

With reference to FIG. 2, selecting one channel 20 from a group of channels is accomplished through use of a high-speed digital multiplexer, generally designated 30. The multiplexer includes a plurality of input pins 32 for receiving input signals from the channels, and switching circuitry 40 for activating one of the channels. A local signal converter in the form of a current-to-voltage converter 50 detects the input pin current and converts it into a voltage, generating an output signal with rising and falling edges corresponding to the detected input signal edges.

Further referring to FIG. 2, and in further descriptive detail, the ATE channels 20 each include respective drivers 24 that respond to waveform formatting circuits (not shown) to generate digital test signals. The signals propagate along cables that serve as transmission lines 26 that are impedance matched at 50 ohms.

Because of the high frequencies envisioned (ranging from one gigahertz to five gigahertz), basic RF transmission line theory is applicable.

The channels 20 terminate on the multiplexer input pins 32, which provide an interface to the multiplexer switching circuitry 40. The switching circuitry includes a plurality of semiconductor switches 42, such as diodes or transistors, to activate a selected channel. In the embodiment shown in FIG. 2, reverse-biased diodes are employed to sense the voltage levels applied to each channel. The activated channel is the one having the tester signal pulse, identified by Vt, applied to the channel. All the other channels having levels raised to a high voltage Vh. The diodes are disposed in parallel and are terminated on a common node 60 within the multiplexer. The node, in turn, connects to the local signal converter 50.

With continued reference to FIG. 2, the local signal converter 50 is, in a preferred form, a transresistance amplifier including a bipolar-junction-transistor (BJT) with a constant voltage Vb applied to the base, and having an emitter tied to the common node 60. An output path couples to the BJT collector to define the multiplexer output OUT. Source voltage Vcc and resistor R1 bias the current source. In this manner, the transresistance amplifier acts as a current controlled voltage source.

In operation, a user selects a particular channel 20 by programming the ATE 10 to drive all but the desired channel to the logical high voltage Vh. Within the multiplexer 30, the base-to-emitter voltage Vb-Ve from the local signal converter 50 sets the common node 60 to a constant voltage. In practice, the voltage Vb-Ve will be higher than the tester signal logic "one" (plus Vdiode), to activate the selected channel, but slightly lower than Vh to keep the rest of the diodes reversed-biased. At the activated input pin, the voltage will be Vb-Ve-Vdiode. This is a constant voltage.

At this point it should be noted that because the common node 60 and the activated input pin 32 are both set to constant voltages, both points act as RF short circuits, as is well known in the art. As a result, at the input pin, the input voltage signal shorts to an "AC" ground. However, the current flowing through the input pin changes its value, corresponding to the energy exchange between the incoming pulse and the virtual "AC" short behavior of the input pin. These current changes cause a corresponding increase in the voltage drop across R1, thereby generating a negative pulse with falling and rising edges at the output OUT, corresponding to the edges of the tester input signal.

Although the pulse edges at the output OUT are delayed somewhat from the original tester input signal, this delay is the same for any selected channel, thus it is easily correctable through calibration procedures. The real benefit is in having an output signal unexposed to any RC effects from within the multiplexer 30. As described above in detail, this is accomplished by keeping the common node 60 at a constant voltage, thus eliminating the effect of potential RC time constants from charging parasitic capacitances acting on the signal edges.

Figure 3:
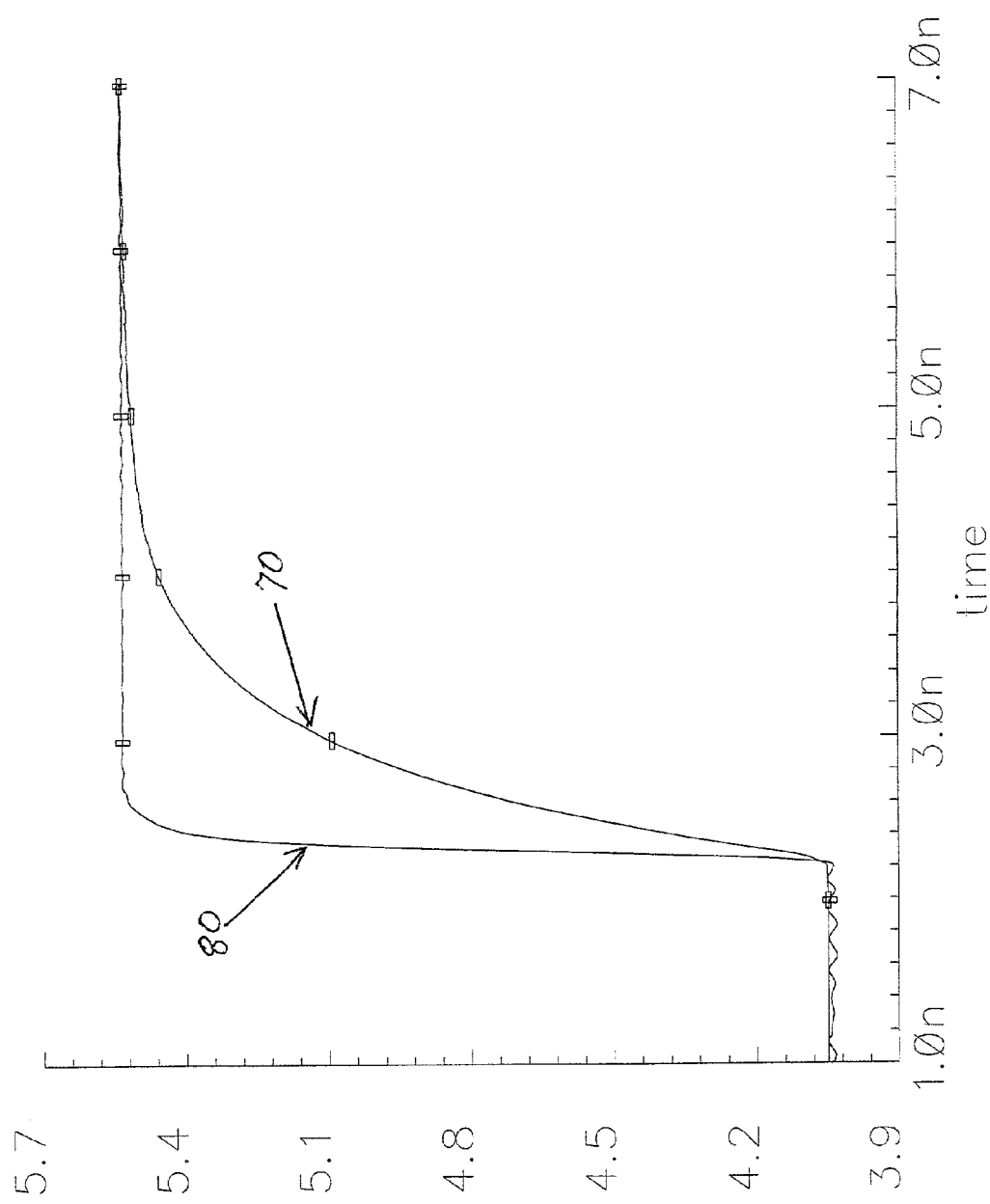
FIG. 3 is a comparative graph illustrating a signal edge rise-time from the output of the present invention versus the signal edge rise-time from a signal passed through a conventional multiplexer.

FIG. 3 illustrates comparative output waveforms from a conventional digital multiplexer at 70, and an output signal according to the present invention, at 80. Note that the waveform at 80 was first scaled to more easily illustrate the comparison. As shown in the graphs, by avoiding the parasitic RC's present on the common node 60, a rise-time improvement on the order of a factor of eight (171 picoseconds versus 1319 picoseconds) is realized.

Figure 4:
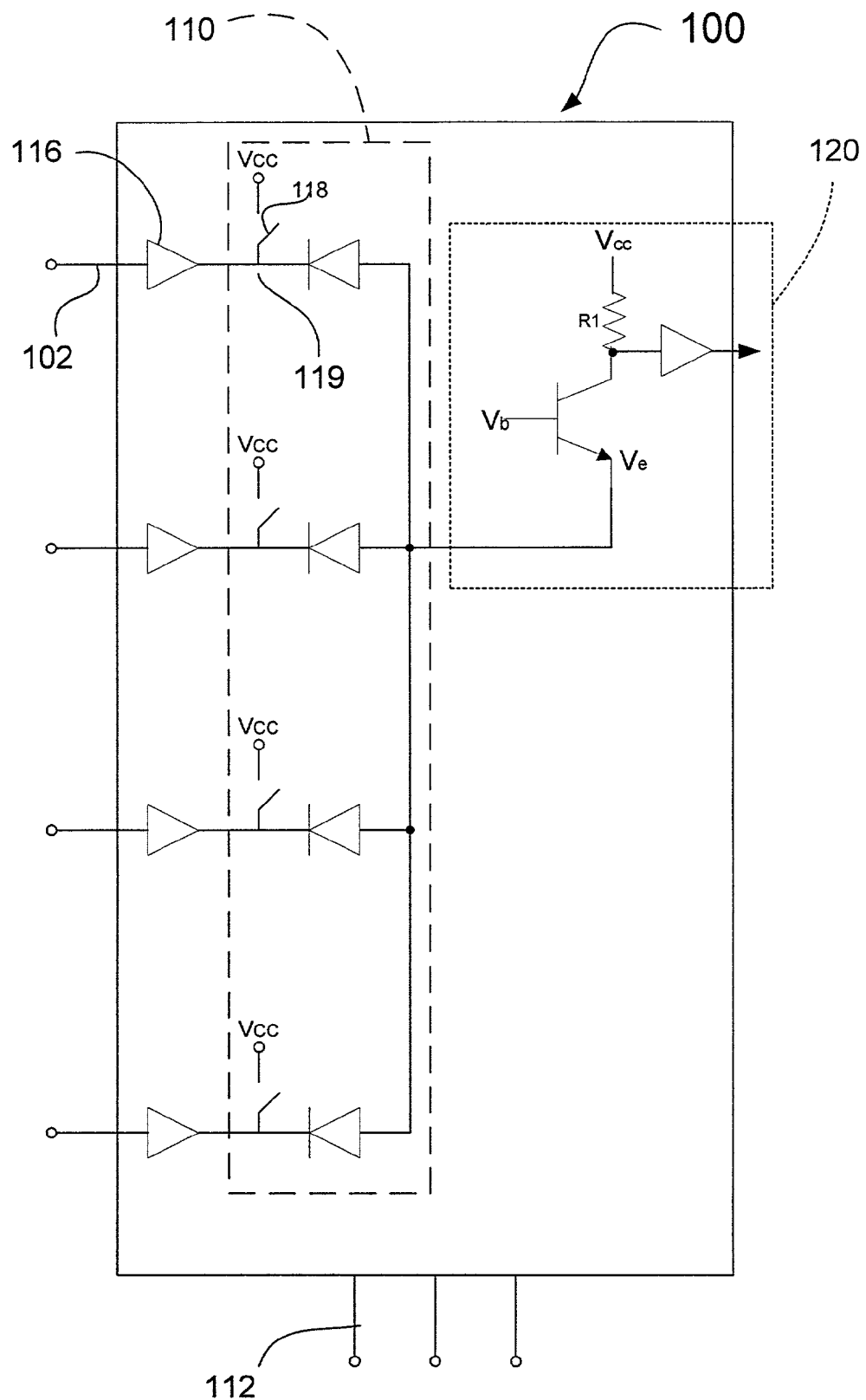
FIG. 4 is a block diagram of a high-speed multiplexer according to a second form of the present invention.

FIG. 4 illustrates the present invention according to a second form, generally designated 100, which is more widely applicable to ATE and non-ATE applications alike. The construction includes a plurality of input pins 102 and switching circuitry 110 coupled to a local signal converter 120. The difference in the second embodiment from the first embodiment lies primarily in the switching circuitry, which doesn't rely on the ATE to assist in the channel selection. Rather, a plurality of selection input bits 112 are provided to digitally identify a selected channel. For each channel, the switching circuitry includes a reverse-biased diode 114 that couples to an input pin buffer 116. Selectively shunting the buffer and the diode is a semiconductor switch 118 which acts to place the diode-to-buffer node, at 119, at the supply voltage Vcc. Those skilled in the art will recognize that in order to shunt the buffer output, the buffer should be in a high-impedance output mode. Overall operation is similar to that described in the first embodiment.

Those skilled in the art will appreciate the many benefits and advantages afforded by the present invention. Of significant importance is the internal conversion of the detected edges of the input signal to produce the multiplexer output signal. This allows the output signal to avoid any parasitic effects that would be present on the common node 60. As a result, the signal timing accuracy is significantly improved.

While the invention has been particularly shown and described with reference to the preferred embodiments thereof, it will be understood by those skilled in the art that various changes in form and detail may be made therein without departing from the spirit and scope of the invention. For example, while two switching schemes were described for the respective embodiments, a variety of switching constructions could be employed in practicing the present invention. Those constructions are intended to be within the scope of the present invention.

What is claimed is:

1. A high-speed digital multiplexer including:
   a plurality of input pins for receiving a plurality of digital input signals;
   switching circuitry coupled to the input pins, the switching circuitry having respective outputs coupled to a common node, the switching circuitry operative to enable a selected one of the plurality of input pins;
   a transresistance amplifier having a circuit branch set to a common voltage, the branch connected to the common node to sense changes in current corresponding to an input signal received by an enabled input pin; and an output pin coupled to the transresistance amplifier, whereby the transresistance amplifier is operative to produce voltage changes at the output corresponding to the sensed current changes.

2. A high-speed digital multiplexer according to claim 1 wherein the switching circuitry comprises:

a plurality of semiconductor switches, the plurality of semiconductor switches corresponding to the plurality of input pins.

3. A high-speed digital multiplexer according to claim 2 wherein the plurality of semiconductor switches comprises a plurality of diodes.

4. A high-speed digital multiplexer according to claim 1 wherein the transresistance amplifier includes:

a base terminal fixed to a constant voltage;
an emitter branch coupled to the common node; and
a collector terminal tied to the output pin.

5. A high-speed digital multiplexer according to clam 1 wherein the switching circuitry is operative to enable the selected one of the plurality of input pins based on the selected one of the plurality of input pins having a lower first voltage than non-selected ones of he plurality of input pins.

6. A high-speed digital multiplexer according to claim 5 wherein the common voltage is higher than the first voltage and at least one voltage of the non-selected ones of the plurality of input pins is higher than the common voltage.

7. A high-speed digital multiplexer for use with a device-interface-board, the device-interface-board adapted for coupling to automatic test equipment, the multiplexer including:

a plurality of input pins adapted for coupling to a plurality of automatic test equipment channels;

switching circuitry coupled to the input pins, the switching circuitry having respective outputs coupled to a common node, the switching circuitry operative to enable a selected one of the plurality of input pins;

a local signal converter having a circuit branch set to a common voltage, th branch connected to the common node to sense changes in current corresponding to input signal received by art enabled input pin;

an output pin coupled to the local signal converter, whereby the local signal converter is operative to produce voltage changes at the output corresponding to the sensed current changes; and wherein the switching circuitry is operative to enable the selected one of plurality of input pins based on the selected one of the plurality of input pins having a lower first voltage than non-selected ones of the plurality input pins.

8. A high-speed digital multiplexer according to claim 7 wherein the switching circuitry comprises:

a plurality of semiconductor switches, the plurality of semiconductor switches corresponding to the plurality of input pins.

9. A high-speed digital multiplexer according to claim 8 wherein the plurality of semiconductor switches comprises a plurality of diodes.

10. A high-speed digital multiplexer according to claim 7 wherein the local signal converter comprises:

a transresistance amplifier.

11. A high-speed digital multiplexer according to claim 10 wherein the transresistance amplifier includes:

a base terminal fixed to a constant voltage;
an emitter branch coupled to the common node; and
a collector terminal tied to the output pin.

12. A high-speed digital multiplexer according to claim 7 wherein the common voltage is higher than the first voltage and at least one voltage of the non-selected ones of he plurality of input pins is higher than the common voltage.

13. A device-interface-board for calibration/validation of automatic test equipment, the device-interface-board including:

at least one test socket adapted for receiving a device-under-test; and a high-speed digital multiplexer for selectively passing tester signals from the automatic test equipment to the test socket, the multiplexer including a plurality of input pins adapted for coupling to a plurality of automatic test equipment channels, switching circuitry coupled to the input pins, the switching circuitry having respective outputs coupled to a common node, the switching circuitry operative to enable a selected one of the plurality of input pins, a transresistance amplifier having a circuit branch set to a common voltage, the branch connected to the common node to sense changes in current corresponding to an input signal received by an enabled input pin, and an output pin coupled to the transresistance amplifier, whereby transresistance amplifier is operative to produce voltage changes at the output corresponding to the sensed current changes.

14. A device-interface-board according to claim 13 wherein the switching circuitry comprises:

a plurality of semiconductor switches, the plurality of semiconductor switches corresponding to the plurality of input pins.

15. A device-interface-board according to claim 14 wherein the plurality of semiconductor switches comprises a plurality of diodes.

16. A device-interface-board according to claim 13 wherein the transresistance amplifier includes:

a base terminal fixed to a constant voltage;
an emitter branch coupled to the common node; and
a collector terminal tied to the output pin.

17. A device-interface-board according to claim 13 wherein the switching circuitry is operative to enable the selected one of the plurality of input pins based on the selected one of the plurality of input pins having a lower first voltage then non-selected ones of the plurality of input pins.

18. A device-interface-board according to claim 17 wherein the common voltage is higher then the first voltage and at least one voltage of the non-selected ones of the plurality of input pins is higher than the common voltage.

* * * * *

UNITED STATES PATENT AND TRADEMARK OFFICE
CERTIFICATE OF CORRECTION

PATENT NO.        : 7,222,041 B2
APPLICATION NO. : 10/010547
DATED             : May 22, 2007
INVENTOR(S)       : Cosmin Iorga It is certified that error appears in the above-identified patent and that said Letters Patent is hereby corrected as shown below:

Column 5, Line 19, Claim 5 currently reads as follows:
"A high-speed digital multiplexer according to clam 1" should read
-- A high-speed digital multiplexer according to claim 1 --

Column 5, Line 37, Claim 7 currently reads as follows:
"common voltage th branch connected to the common" should read
-- common voltage the branch connected to the common --

Column 5, Line 39, Claim 7 currently reads as follows:
"signal received by art enabled input pin" should read
-- signal received by an enabled input pin --

Column 5, Line 45, Claim 7 currently reads as follows:
"selected one of plurality of input pins based on the" should read
-- selected one of the plurality of input pins based on the --

Column 6, Line 6, Claim 12 currently reads as follows:
"A high-speed digital multiplexer according to claim 7" should read
-- A high-speed digital multiplexer according to claim 5 --

Column 6, Line 8, Claim 12 currently reads as follows:
"and at least one voltage of the non-selected ones of he" should read
-- and at least one voltage of the non-selected ones of the --

Column 6, Line 52, Claim 17 currently reads as follows:
"voltage then non-selected ones of the plurality of input pins." should read
-- voltage than non-selected ones of the plurality of input pins. --

UNITED STATES PATENT AND TRADEMARK OFFICE
CERTIFICATE OF CORRECTION

PATENT NO. : 7,222,041 B2
APPLICATION NO. : 10/010547
DATED : May 22, 2007
INVENTOR(S) : Cosmin Iorga It is certified that error appears in the above-identified patent and that said Letters Patent is hereby corrected as shown below:

Column 6, Line 54, Claim 18 currently reads as follows:
"wherein the common voltage is higher then the first voltage" should read
-- wherein the common voltage is higher than the first voltage --

Signed and Sealed this

Thirty-first Day of July, 2007

JON W. DUDAS
*Director of the United States Patent and Trademark Office*